United States Patent
Lin

(10) Patent No.: US 11,166,389 B2
(45) Date of Patent: Nov. 2, 2021

(54) ASSEMBLY STRUCTURE AND DISPLAY DEVICE

(71) Applicant: QISDA CORPORATION, Taoyuan (TW)

(72) Inventor: Chih-Ying Lin, Taoyuan (TW)

(73) Assignee: Qisda Corporation, Taoyuan (TW)

(*) Notice: Subject to any disclaimer, the term of this patent is extended or adjusted under 35 U.S.C. 154(b) by 0 days.

(21) Appl. No.: 16/917,935

(22) Filed: Jul. 1, 2020

(65) Prior Publication Data
US 2021/0227705 A1   Jul. 22, 2021

(30) Foreign Application Priority Data

Jan. 20, 2020 (CN) .......................... 202010067764.8

(51) Int. Cl.
| H05K 7/02 | (2006.01) |
| H05K 7/04 | (2006.01) |
| H05K 5/00 | (2006.01) |
| H05K 5/02 | (2006.01) |

(52) U.S. Cl.
CPC ......... *H05K 5/0017* (2013.01); *H05K 5/0217* (2013.01)

(58) Field of Classification Search
USPC .......................................... 361/807, 809, 810
See application file for complete search history.

(56) References Cited

U.S. PATENT DOCUMENTS

| 9,753,315 | B2* | 9/2017 | Park ................... G02F 1/133606 |
| 10,345,646 | B2* | 7/2019 | Tomizuka ......... G02F 1/133606 |
| 2015/0078032 | A1* | 3/2015 | Horiguchi ............ G02B 6/0031 |
| | | | 362/607 |
| 2016/0011364 | A1* | 1/2016 | Horiguchi ............ G02B 6/0088 |
| | | | 362/606 |

* cited by examiner

*Primary Examiner* — Hung S. Bui

(57) ABSTRACT

An assembly structure includes a first assembly member, a second assembly member and a retaining member. The first assembly member includes a plurality of protruding portions and each of the protruding portions has a recess. The second assembly member includes a plurality of restraining portions. The restraining portions are disposed with respect to the protruding portions by a plurality of relative offsets and the relative offsets are different from each other. Each of the restraining portions is capable of passing through the recess of the protruding portion correspondingly. The retaining member is disposed on one of the protruding portions and covers the recess correspondingly. When the second assembly member is assembled to the first assembly member, one of the restraining portions abuts against the retaining member.

18 Claims, 9 Drawing Sheets

ASSEMBLY STRUCTURE AND DISPLAY DEVICE

BACKGROUND OF THE INVENTION

1. Field of the Invention

The invention relates to an assembly structure and a display device and, more particularly, to an assembly structure capable of adjusting relative position between two assembly members and a display device equipped with the assembly structure.

2. Description of the Prior Art

At present, lots of devices are assembled by different assembly members. For example, a display device has to be assembled by a front bezel and a back plate of a display module during manufacture. For the display device, a central hole of the front bezel is a view area (VA) and the display module provides an active area (AA). When the display device is manufactured, every component may have a size tolerance and an assembly tolerance. Thus, the view area must be larger than the active area, so as to prevent edge pixels of the active area from being blocked by the front bezel. Accordingly, the periphery of the active area has a black matrix (BM) without active pixels. When the front bezel is white and the display device displays a white picture, the black matrix is quite obvious and incongruous.

SUMMARY OF THE INVENTION

An objective of the invention is to provide an assembly structure capable of adjusting relative position between two assembly members and a display device equipped with the assembly structure, such that the assembly position can be adjusted rapidly and reliably.

According to an embodiment of the invention, an assembly structure comprises a first assembly member, a second assembly member and a retaining member. The first assembly member comprises a plurality of protruding portions and each of the protruding portions has a recess. The second assembly member comprises a plurality of restraining portions. The restraining portions are disposed with respect to the protruding portions by a plurality of relative offsets and the relative offsets are different from each other. Each of the restraining portions is capable of passing through the recess of the protruding portion correspondingly. The retaining member is disposed on one of the protruding portions and covers the recess correspondingly. When the second assembly member is assembled to the first assembly member, one of the restraining portions abuts against the retaining member.

As mentioned in the above, the restraining portions of the second assembly member are disposed with respect to the protruding portions of the first assembly member by a plurality of relative offsets. When an assembler assembles the first assembly member and the second assembly member first time, the assembler may dispose the retaining member on one of the protruding portions to adjust relative position between the first assembly member and the second assembly member. Then, the assembler checks whether the relative position between the first assembly member and the second assembly member satisfies a requirement. If the requirement is satisfied, the relative position between the first assembly member and the second assembly member does not need to be adjusted again. If the requirement is not satisfied, the assembler has to dispose the retaining member on another protruding portion again according to the desired position and then checks the relative position between the first assembly member and the second assembly member again until the requirement is satisfied. Then, according to general manufacture experience, components with different batch numbers may have larger size variability while components with identical batch number may have smaller size variability. Accordingly, other machines using the components with identical batch number may dispose the retaining member according to the position of the retaining member determined by the first machine. If the sizes of the first assembly member and the second assembly member with identical batch number are stable, we may expect that the assembly position of most assembly structures should satisfy the requirement and a few number of the assembly structures with unsatisfied offset may be adjusted individually. Therefore, the time of adjustment can be saved for each machine. Furthermore, when the first assembly member and the second assembly member are disassembled and maintained, a user may keep the retaining member on the original protruding portion, such that the relative position can be recovered accurately while reassembling the first assembly member and the second assembly member. Since the operation of the invention is simple and the invention does not need to use specific assembly tool, the invention can enhance assembly efficiency and reduce manufacture cost effectively. In an embodiment, the first assembly member may be a front bezel of a display device and the second assembly member may be a back plate of a display module of the display device. Accordingly, the front bezel and the back plate of the display device can be positioned and adjusted accurately by the retaining member, the protruding portions and the restraining portions.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
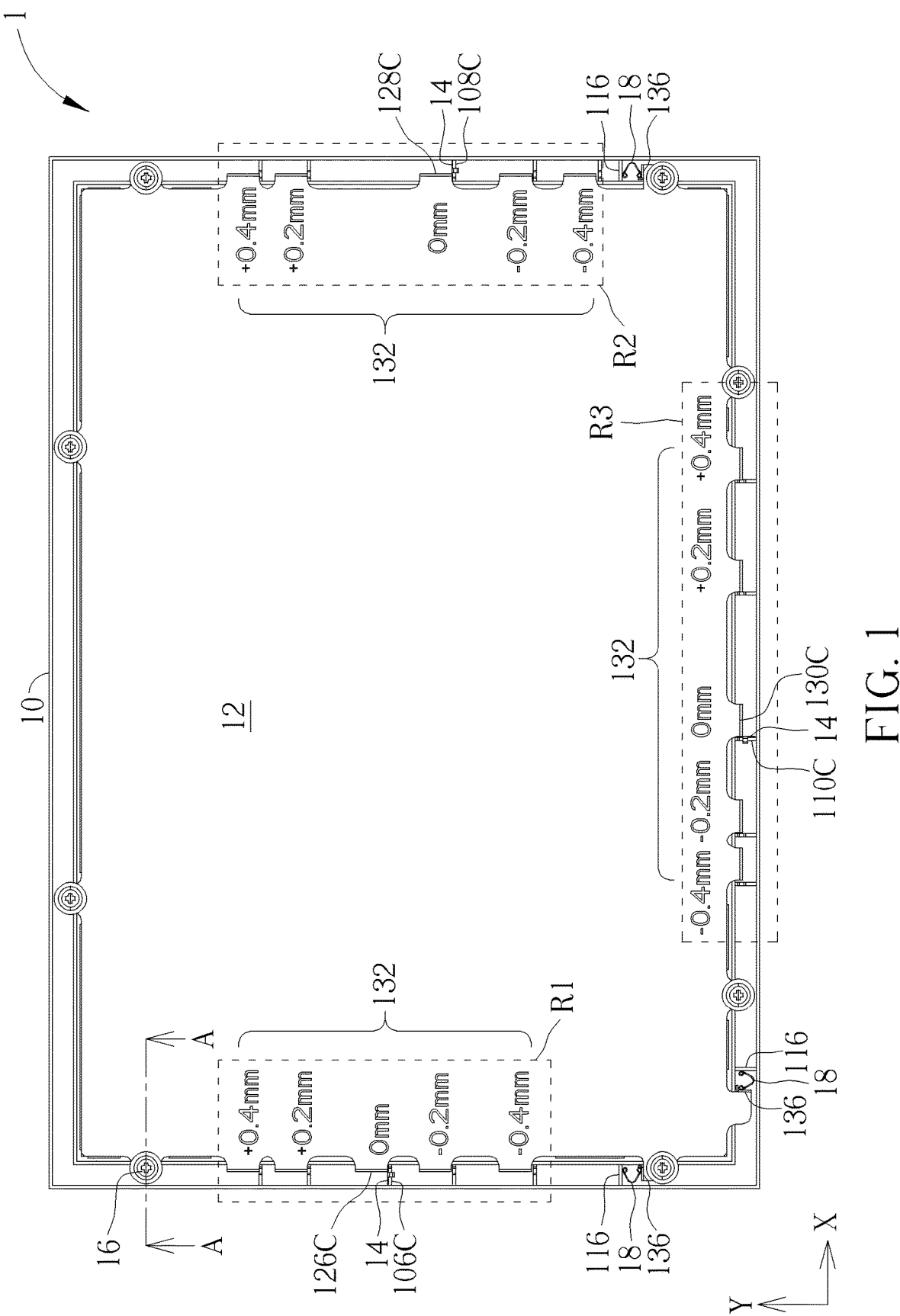
FIG. 1 is an assembly view illustrating an assembly structure according to an embodiment of the invention.
Figure 2:
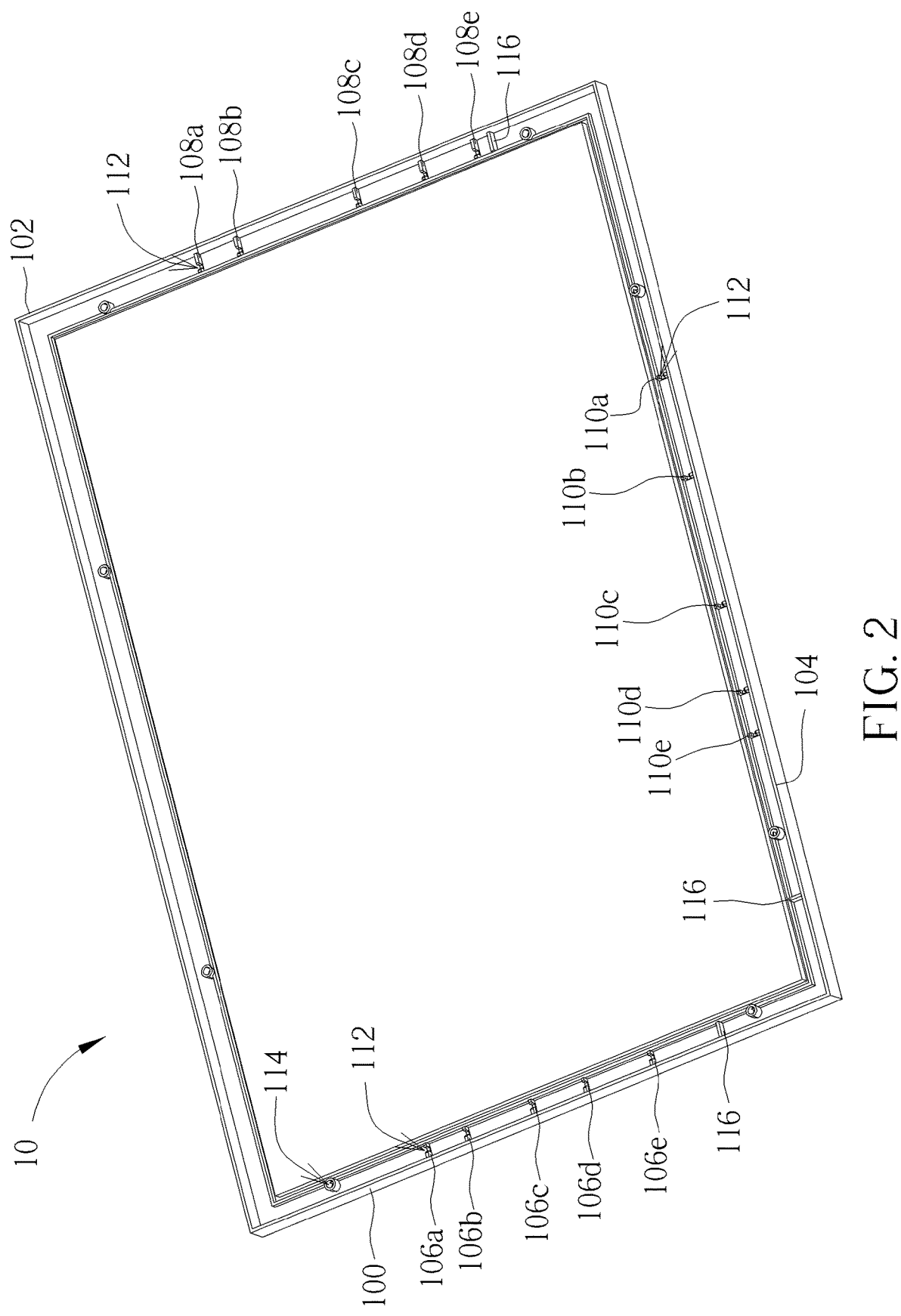
FIG. 2 is a perspective view illustrating the first assembly member shown in FIG. 1.
Figure 3:
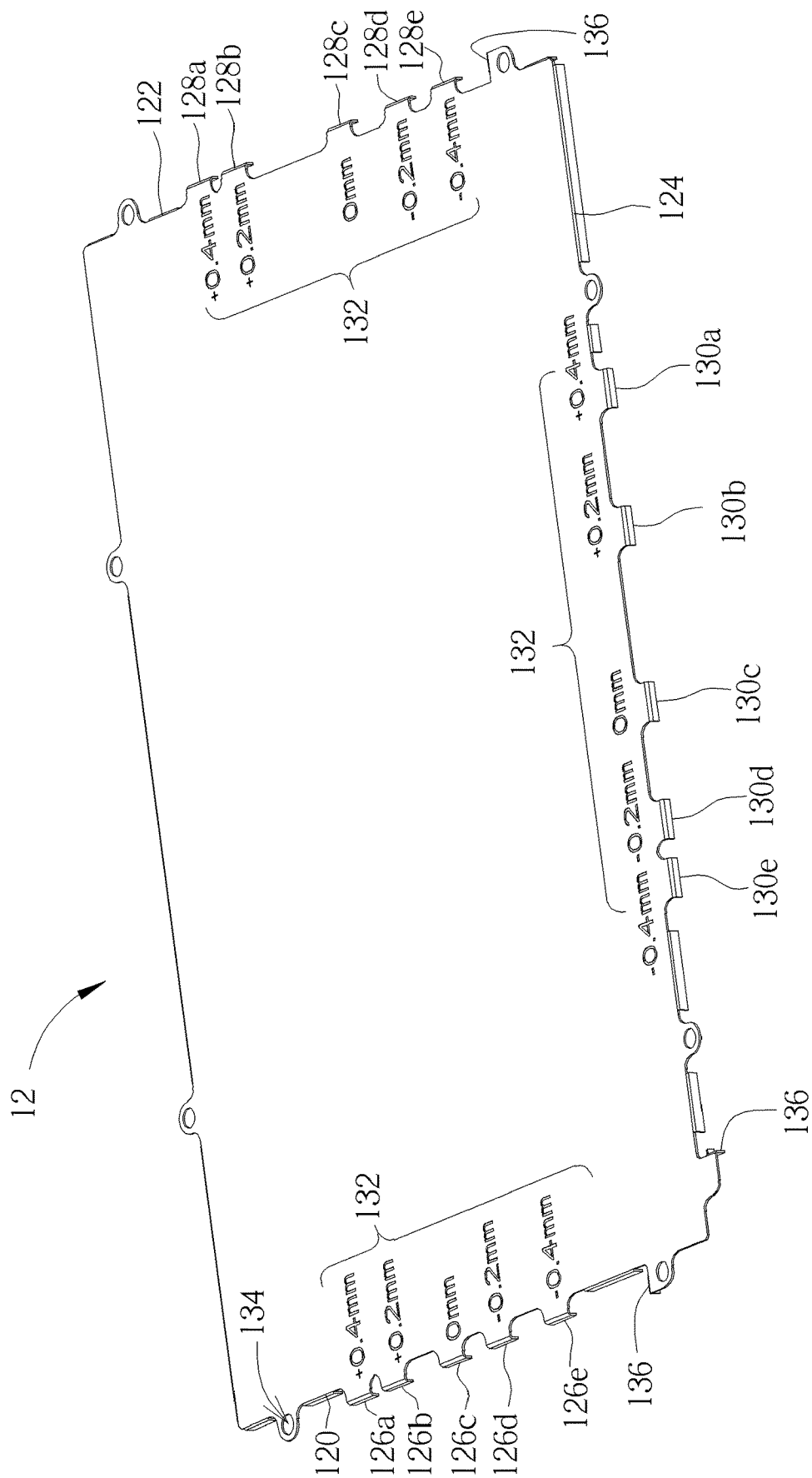
FIG. 3 is a perspective view illustrating the second assembly member shown in FIG. 1.
Figure 4:
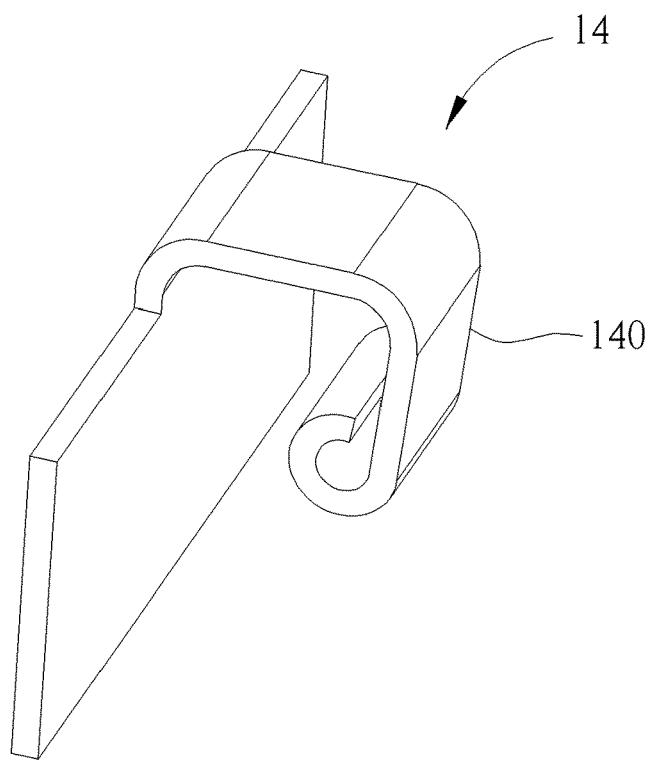
FIG. 4 is a perspective view illustrating the retaining member shown in FIG. 1.
Figure 5:
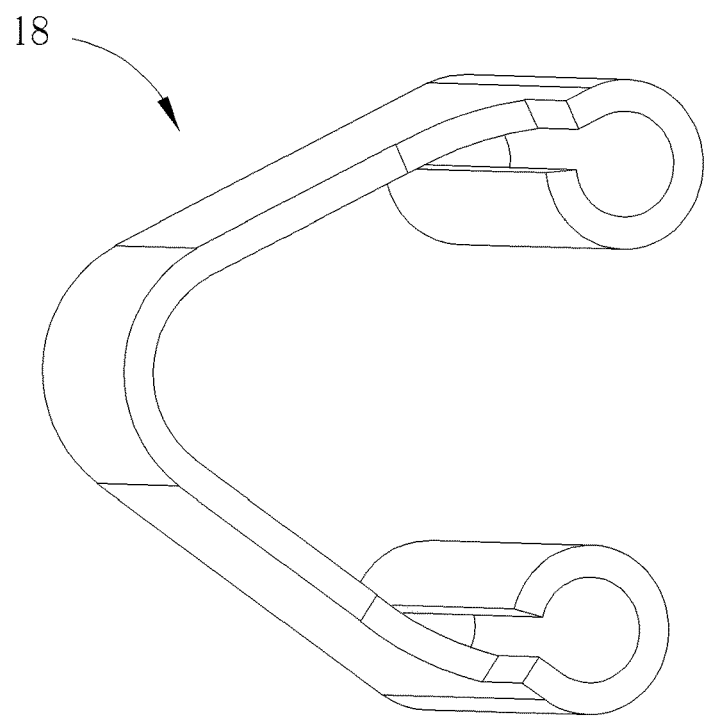
FIG. 5 is a perspective view illustrating the elastic member shown in FIG. 1.
Figure 6:
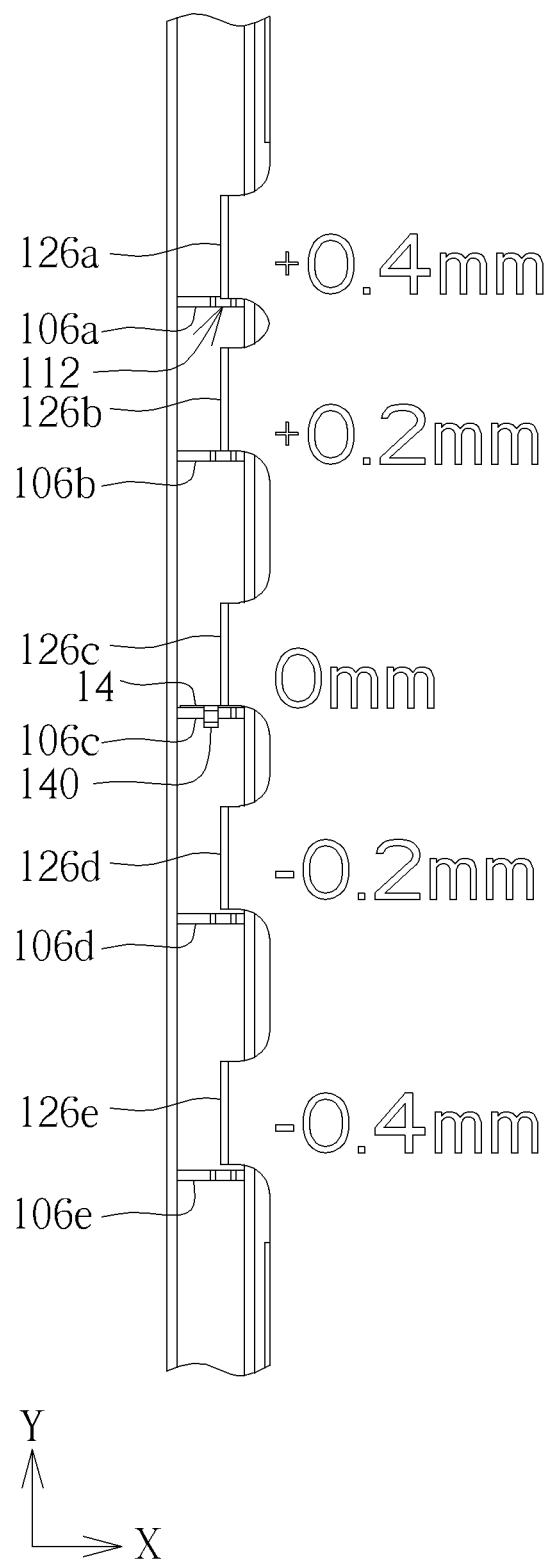
FIG. 6 is an enlarged view illustrating the partial region shown in FIG. 1.
Figure 7:
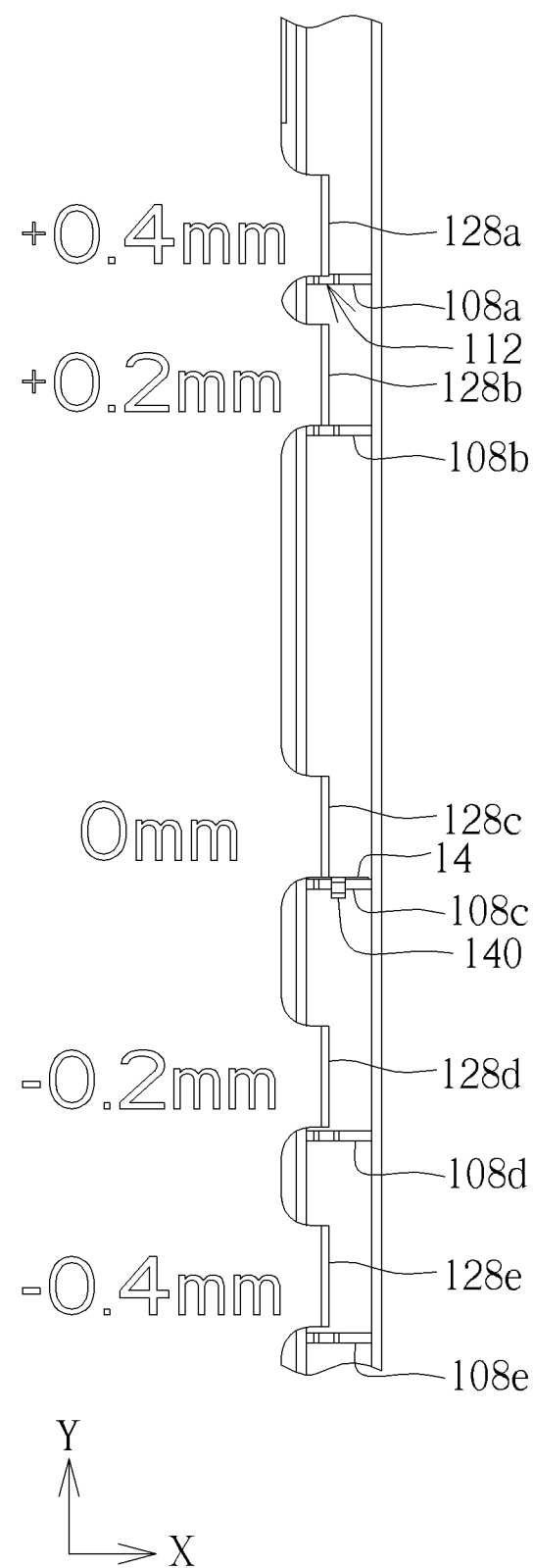
FIG. 7 is an enlarged view illustrating the partial region shown in FIG. 1.
Figure 8:
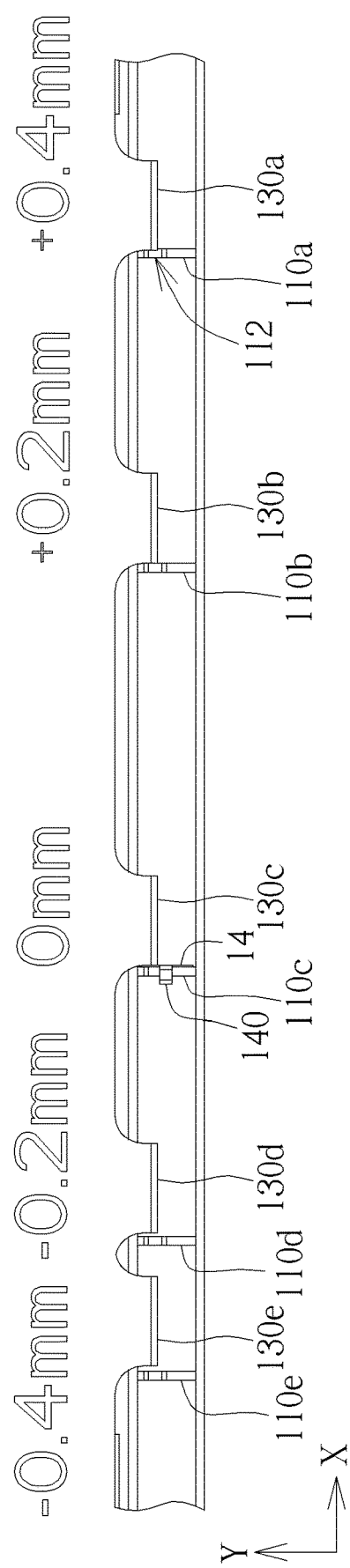
FIG. 8 is an enlarged view illustrating the partial region shown in FIG. 1.
Figure 9:
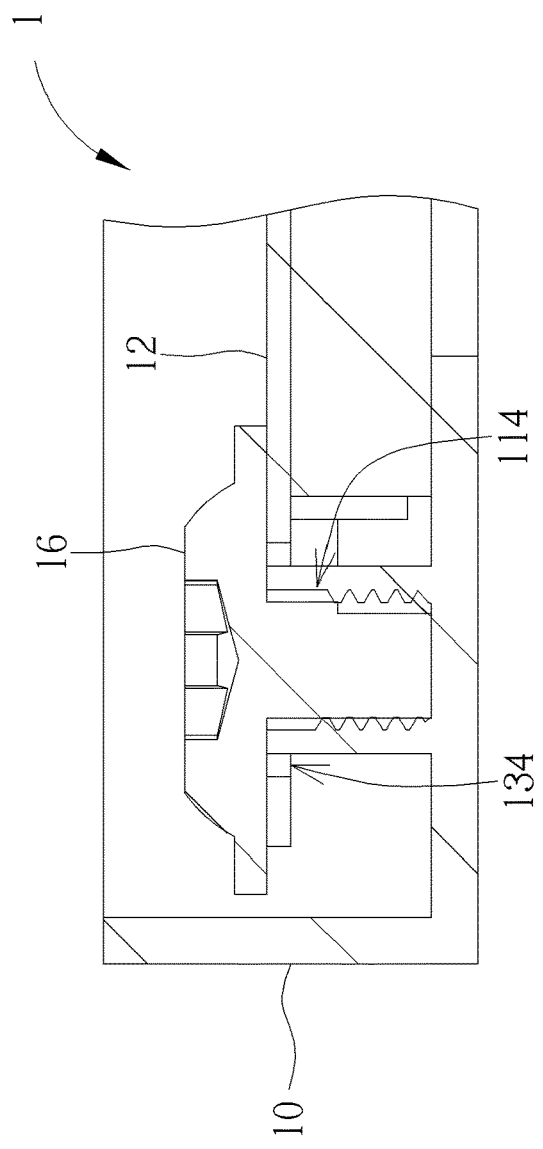
FIG. 9 is a sectional view illustrating the assembly structure shown in FIG. 1 along line A-A.
Figure 10:
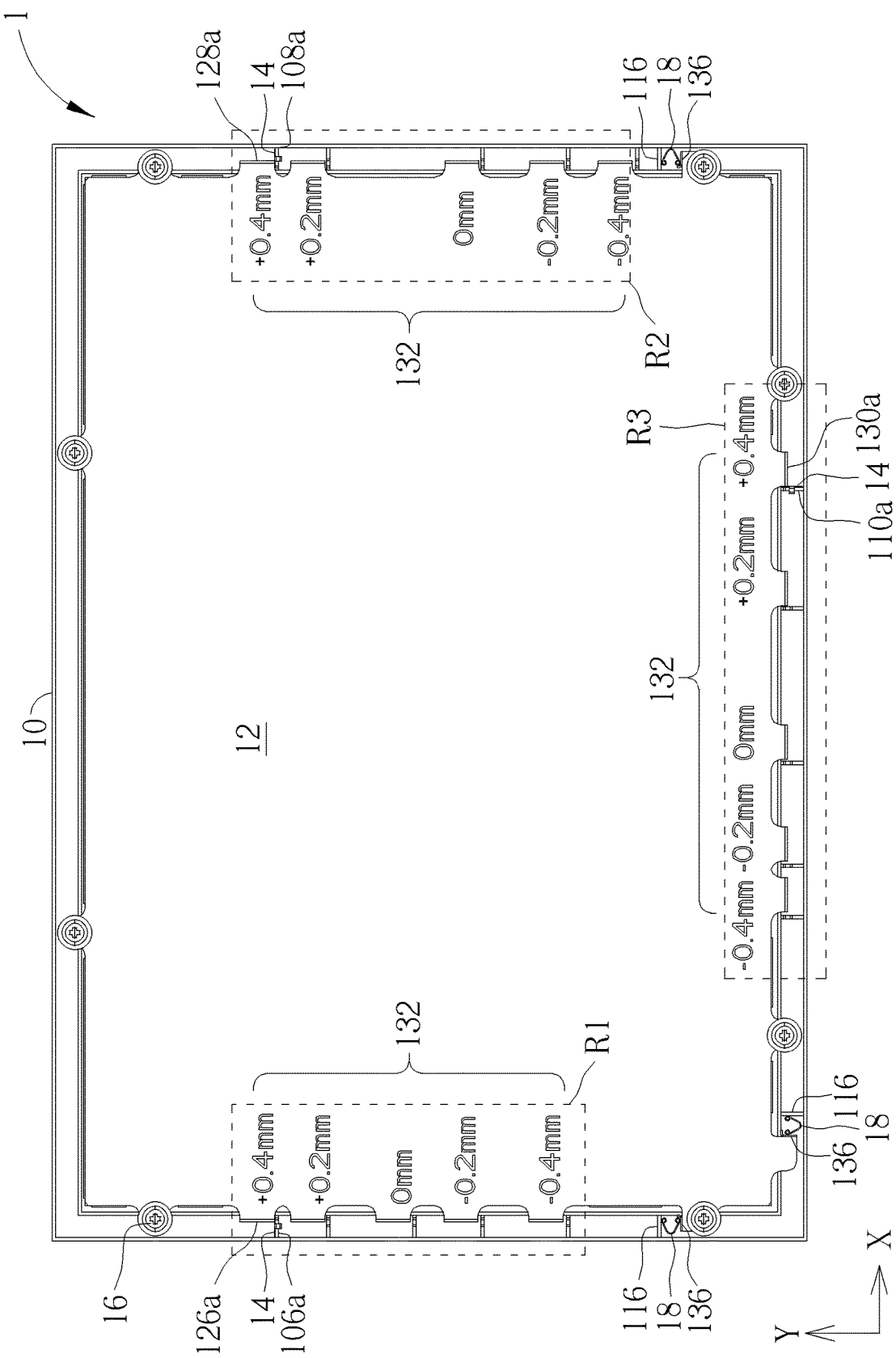
FIG. 10 is another assembly view illustrating the assembly structure shown in FIG. 1.
Figure 11:
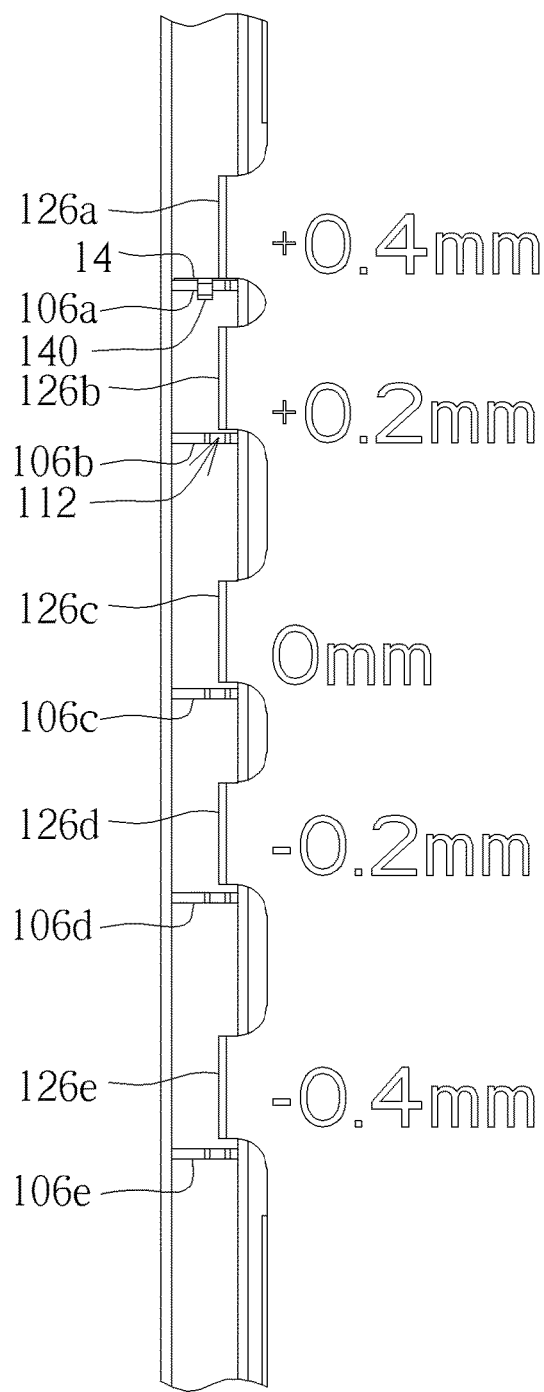
FIG. 11 is an enlarged view illustrating the partial region shown in FIG. 10.
Figure 12:
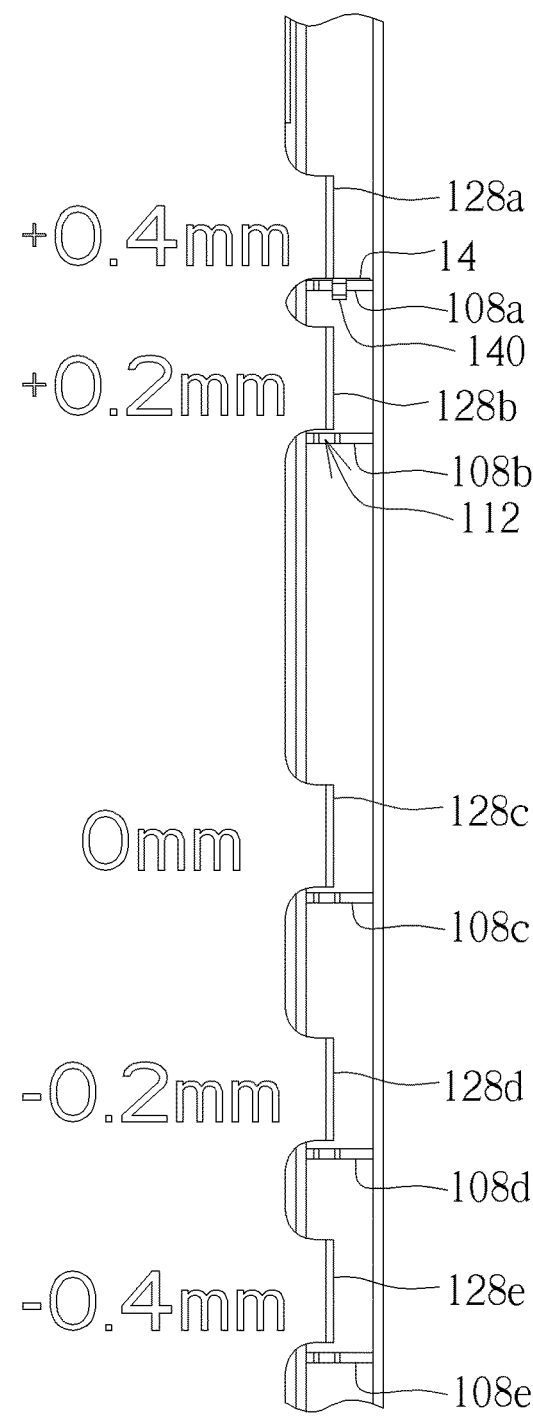
FIG. 12 is an enlarged view illustrating the partial region shown in FIG. 10.
Figure 13:
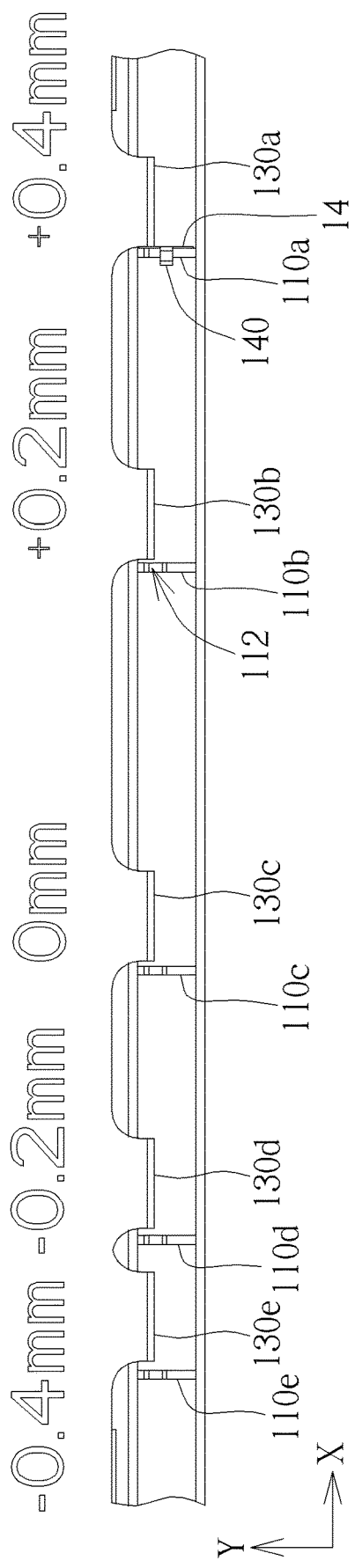
FIG. 13 is an enlarged view illustrating the partial region shown in FIG. 10.

Referring to FIGS. 1 to 13, FIG. 1 is an assembly view illustrating an assembly structure 1 according to an embodiment of the invention, FIG. 2 is a perspective view illustrating the first assembly member 10 shown in FIG. 1, FIG. 3 is a perspective view illustrating the second assembly member 12 shown in FIG. 1, FIG. 4 is a perspective view illustrating the retaining member 14 shown in FIG. 1, FIG. 5 is a perspective view illustrating the elastic member 18 shown in FIG. 1, FIG. 6 is an enlarged view illustrating the partial region R1 shown in FIG. 1, FIG. 7 is an enlarged view illustrating the partial region R2 shown in FIG. 1, FIG. 8 is an enlarged view illustrating the partial region R3 shown in FIG. 1, FIG. 9 is a sectional view illustrating the assembly structure 1 shown in FIG. 1 along line A-A, FIG. 10 is another assembly view illustrating the assembly structure 1 shown in FIG. 1, FIG. 11 is an enlarged view illustrating the partial region R1 shown in FIG. 10, FIG. 12 is an enlarged view illustrating the partial region R2 shown in FIG. 10, and FIG. 13 is an enlarged view illustrating the partial region R3 shown in FIG. 10.

As shown in FIG. 1, the assembly structure 1 comprises a first assembly member 10 and a second assembly member 12. In this embodiment, the first assembly member 10 may be, but not limited to, a front bezel of a display device and the second assembly member 12 may be, but not limited to, a back plate of a display module of the display device. In practical applications, the first assembly member 10 and the second assembly member 12 may be any components with a requirement of relative position. In this embodiment, the first assembly member 10 and the second assembly member 12 may be, but not limited to, rectangular.

As shown in FIG. 2, each of three edges 100, 102, 104 of the first assembly member 10 may comprise a plurality of protruding portions. In this embodiment, the edge 100 may comprise five protruding portions 106a-106e, the edge 102 may comprise five protruding portions 108a-108e, and the edge 104 may comprise five protruding portions 110a-110e. It should be noted that the number and position of the protruding portions of each edge of the first assembly member 10 may be determined according to practical applications, so the invention is not limited to the embodiment shown in the figure. Furthermore, since the edge 100 is opposite to the edge 102, the edges 100 and 102 needs to have identical number of protruding portions. In this embodiment, each of the protruding portions 106a-106e, 108a-108e, 110a-110e may have a recess 112.

As shown in FIG. 3, each of three edges 120, 122, 124 of the second assembly member 12 may comprise a plurality of restraining portions. In this embodiment, the edge 120 may comprise five restraining portions 126a-126e, the edge 122 may comprise five restraining portions 128a-128e, and the edge 124 may comprise five restraining portions 130a-130e. It should be noted that the number and position of the restraining portions of each edge of the second assembly member 12 may be determined according to practical applications, so the invention is not limited to the embodiment shown in the figure. Furthermore, since the edge 120 is opposite to the edge 122, the edges 120 and 122 needs to have identical number of restraining portions. Still further, the three edges 120, 122, 124 of the second assembly member 12 correspond to the three edges 100, 102, 104 of the first assembly member 10. Thus, the number of the restraining portions of the three edges 120, 122, 124 of the second assembly member 12 corresponds to the number of the protruding portions of the three edges 100, 102, 104 of the first assembly member 10, respectively. In this embodiment, the restraining portions 126a-126e, 128a-128e, 130a-130e may be formed by bending a periphery of the second assembly member 12. Moreover, each of the restraining portions 126a-126e, 128a-128e, 130a-130e is capable of passing through the recess 112 of the protruding portions 106a-106e, 108a-108e, 110a-110e correspondingly.

In this embodiment, the assembly structure 1 further comprises three retaining members 14, wherein each of the retaining members 14 may be disposed on one of the protruding portions 106a-106e, 108a-108e, 110a-110e and covers the recess 112 correspondingly. As shown in FIG. 4, the retaining member 14 may have a clamping portion 140. Accordingly, the retaining member 14 may clamp one of the protruding portions 106a-106e, 108a-108e, 110a-110e by the clamping portion 140.

When a user wants to assemble the second assembly member 12 to the first assembly member 10, the user may use three retaining members 14 to clamp one of the protruding portions 106a-106e, 108a-108e, 110a-110e of the three edges of the first assembly member 10, respectively. As shown in FIGS. 1 and 6-8, three retaining members 14 clamp the protruding portions 106c, 108c, 110c, respectively. Then, the user may place the second assembly member 12 on the first assembly member 10 and push the second assembly member 12 toward −Y and −X directions, such that the restraining portions 126c, 128c, 130c abut against the retaining members 14, respectively.

In this embodiment, the restraining portions 126a-126e, 128a-128e, 130a-130e of the second assembly member 12 are disposed with respect to the protruding portions 106a-106e, 108a-108e, 110a-110e of the first assembly member 10 by a plurality of relative offsets, wherein the relative offsets are different from each other. Furthermore, the second assembly member 12 may further comprise a plurality of marks 132, wherein the marks 132 are disposed with respect to the restraining portions 126a-126e, 128a-128e, 130a-130e and configured to indicate the relative offsets.

As shown in FIGS. 6 and 7, when two retaining members 14 clamp the protruding portions 106c, 108c and the restraining portions 126c, 128c abut against the two retaining members 14, the relative offset between the first assembly member 10 and the second assembly member 12 in Y direction is 0 mm. Accordingly, the marks 132 disposed with respect to the restraining portions 126c, 128c indicate 0 mm. As shown in FIG. 8, when the retaining member 14 clamps the protruding portion 110c and the restraining portion 130c abuts against the retaining members 14, the relative offset between the first assembly member 10 and the second assembly member 12 in X direction is 0 mm. Accordingly, the mark 132 disposed with respect to the restraining portion 130c indicates 0 mm.

As shown in FIGS. 10 to 13, three retaining members 14 may also clamp the protruding portions 106a, 108a 110a. Then, the user may place the second assembly member 12 on the first assembly member 10 and push the second assembly member 12 toward −Y and −X directions, such that the restraining portions 126a, 128a, 130a abut against the retaining members 14, respectively. As shown in FIGS. 11 and 12, when two retaining members 14 clamp the protruding portions 106a, 108a and the restraining portions 126a, 128a abut against the two retaining members 14, the relative offset between the first assembly member 10 and the second assembly member 12 in Y direction is +0.4 mm.

Accordingly, the marks 132 disposed with respect to the restraining portions 126a, 128a indicate +0.4 mm. As shown in FIG. 13, when the retaining member 14 clamps the protruding portion 110a and the restraining portion 130a abuts against the retaining members 14, the relative offset between the first assembly member 10 and the second assembly member 12 in X direction is +0.4 mm. Accordingly, the mark 132 disposed with respect to the restraining portion 130a indicates +0.4 mm.

It should be noted that the invention may set the relative offsets between the restraining portions and the protruding portions according to practical applications. For example, the relative offsets may be −0.4 mm, −0.3 mm, −0.2 mm. −0.1 mm, 0 mm, +0.1 mm, +0.2 mm, +0.3 mm, +0.4 mm, i.e. the difference between two relative offsets may be an absolute value of 0.1 mm, or, alternatively, the relative offset may be positive value or negative value. For example, the relative offsets may be −0.4 mm, −0.2 mm and 0 mm or may be 0 mm, +0.2 mm and +0.4 mm.

Therefore, as shown in tables 1 and 2 below, after the first assembly member 10 and the second assembly member 12 are assembled, the invention may provide different positioning effects with different relative offsets for the first assembly member 10 and the second assembly member 12 by the retaining members 14, the restraining portions 126a, 128a, 130a and the protruding portions 106a, 108a 110a. Furthermore, the user may dispose the retaining member 14 on the corresponding protruding portion according to the marks 132. It should be noted that the values of the relative offsets shown in tables 1 and 2 are for purpose of illustration only. The invention may set the relative offsets between the restraining portions and the protruding portions according to practical applications.

TABLE 1

| | |
|---|---|
| Two retaining members 14 clamp the protruding portions 106a, 108a and the restraining portions 126a, 128a abut against the two retaining members 14 | The relative offset between the first assembly member 10 and the second assembly member 12 in Y direction is +0.4 mm |
| Two retaining members 14 clamp the protruding portions 106b, 108b and the restraining portions 126b, 128b abut against the two retaining members 14 | The relative offset between the first assembly member 10 and the second assembly member 12 in Y direction is +0.2 mm |
| Two retaining members 14 clamp the protruding portions 106c, 108c and the restraining portions 126c, 128c abut against the two retaining members 14 | The relative offset between the first assembly member 10 and the second assembly member 12 in Y direction is 0 mm |
| Two retaining members 14 clamp the protruding portions 106d, 108d and the restraining portions 126d, 128d abut against the two retaining members 14 | The relative offset between the first assembly member 10 and the second assembly member 12 in Y direction is −0.2 mm |
| Two retaining members 14 clamp the protruding portions 106e, 108e and the restraining portions 126e, 128e abut against the two retaining members 14 | The relative offset between the first assembly member 10 and the second assembly member 12 in Y direction is −0.4 mm |

TABLE 2

| | |
|---|---|
| The retaining member 14 clamps the protruding portion 110a and the restraining portion 130a abuts against the retaining members 14 | The relative offset between the first assembly member 10 and the second assembly member 12 in X direction is +0.4 mm |
| The retaining member 14 clamps the protruding portion 110b and the restraining portion 130b abuts against the retaining members 14 | The relative offset between the first assembly member 10 and the second assembly member 12 in X direction is +0.2 mm |
| The retaining member 14 clamps the protruding portion 110c and the restraining portion 130c abuts against the retaining members 14 | The relative offset between the first assembly member 10 and the second assembly member 12 in X direction is 0 mm |
| The retaining member 14 clamps the protruding portion 110d and the restraining portion 130d abuts against the retaining members 14 | The relative offset between the first assembly member 10 and the second assembly member 12 in X direction is −0.2 mm |
| The retaining member 14 clamps the protruding portion 110e and the restraining portion 130e abuts against the retaining members 14 | The relative offset between the first assembly member 10 and the second assembly member 12 in X direction is −0.4 mm |

In another embodiment, the two retaining members 14 located at right side and left side of FIGS. 1 and 7 may also be disposed on two protruding portions with different relative offsets, such that a tilt positioning effect is generated between the first assembly member 10 and the second assembly member 12. For example, the retaining member 14 at the left side may be disposed on the protruding portion 106c and the retaining member 14 at the right side may be disposed on the protruding portion 108a, such that the relative offset between the first assembly member 10 and the second assembly member 12 in Y direction at right side is +0.4 mm.

In this embodiment, the assembly structure 1 may further comprise a plurality of fixing members 16 (e.g. screws). Furthermore, the first assembly member 10 may further comprise a plurality of fixing holes 114 (e.g. screw holes) and the second assembly member 12 may further comprise a plurality of through holes 134, wherein the through holes 134 are disposed with respect to the fixing holes 114 of the first assembly member 10. After positioning the first assembly member 10 and the second assembly member 12 with each other, the through holes 134 are aligned with the fixing holes 114, as shown in FIG. 9. Then, the fixing members 16 can pass through the through holes 134 and be fixed in the fixing holes 114, so as to fix the first assembly member 10 and the second assembly member 12 with each other.

In this embodiment, the through hole 134 may be larger than the fixing hole 114 and a diameter of a thread of the fixing member 16 and the recess 112 may be larger than a width of each of the restraining portions 126a, 128a, 130a, such that the position of the second assembly member 12 may be slightly adjusted with respect to the first assembly member 10 in X and Y directions.

In this embodiment, the assembly structure 1 may further comprise three elastic members 18. As shown in FIG. 5, the elastic member 18 may be, but not limited to, a V-shaped elastic plate. In another embodiment, the elastic member 18 may also be a spring or other elastic bodies according to practical applications. Furthermore, each of the three edges 100, 102, 104 of the first assembly member 10 may further comprise a first positioning portion 116 and each of the three edges 120, 122, 124 of the second assembly member 12 may further comprise a second positioning portion 136, wherein the second positioning portion 136 is disposed with respect to the first positioning portion 116. After placing the second assembly member 12 on the first assembly member 10, the user may dispose the elastic member 18 between the first positioning portion 116 and the second positioning portion 136, such that opposite ends of the elastic member 18 abut against the first positioning portion 116 and the second positioning portion 136, so as to position the first assembly member 10 and the second assembly member 12 with each other by an elastic force of the elastic member 18. Then, the user may use the fixing members 16 to fix the first assembly member 10 and the second assembly member 12 with each other. Needless to say, the invention may not dispose the elastic member 18 and the user may position the first assembly member 10 and the second assembly member 12 with each other manually.

As mentioned in the above, the restraining portions of the second assembly member are disposed with respect to the protruding portions of the first assembly member by a plurality of relative offsets. When an assembler assembles the first assembly member and the second assembly member first time, the assembler may dispose the retaining member on one of the protruding portions to adjust relative position between the first assembly member and the second assembly member. Then, the assembler checks whether the relative position between the first assembly member and the second assembly member satisfies a requirement. If the requirement is satisfied, the relative position between the first assembly member and the second assembly member does not need to be adjusted again. If the requirement is not satisfied, the assembler has to dispose the retaining member on another protruding portion again according to the desired position and then checks the relative position between the first assembly member and the second assembly member again until the requirement is satisfied. Then, according to general manufacture experience, components with different batch numbers may have larger size variability while components with identical batch number may have smaller size variability. Accordingly, other machines using the components with identical batch number may dispose the retaining member according to the position of the retaining member determined by the first machine. If the sizes of the first assembly member and the second assembly member with identical batch number are stable, we may expect that the assembly position of most assembly structures should satisfy the requirement and a few number of the assembly structures with unsatisfied offset may be adjusted individually. Therefore, the time of adjustment can be saved for each machine. Furthermore, when the first assembly member and the second assembly member are disassembled and maintained, a user may keep the retaining member on the original protruding portion, such that the relative position can be recovered accurately while reassembling the first assembly member and the second assembly member. Since the operation of the invention is simple and the invention does not need to use specific assembly tool, the invention can enhance assembly efficiency and reduce manufacture cost effectively. In an embodiment, the first assembly member may be a front bezel of a display device and the second assembly member may be a back plate of a display module of the display device. Accordingly, the front bezel and the back plate of the display device can be positioned and adjusted accurately by the retaining member, the protruding portions and the restraining portions.

Furthermore, according to the assembly structure of the aforesaid embodiments, the invention further provides a display device, wherein the display device comprises the assembly structure mentioned in any of the aforesaid embodiments and a display unit disposed in the assembly structure.

The aforesaid display unit may comprise a liquid crystal display (LCD) or an organic light emitting diode (OLED) display. It should be noted that the size and shape of the display unit correspond to the size and shape of the assembly structure and those may be determined according to practical applications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An assembly structure comprising:
   a first assembly member comprising a plurality of protruding portions, each of the protruding portions having a recess;
   a second assembly member comprising a plurality of restraining portions, the restraining portions being disposed with respect to the protruding portions by a plurality of relative offsets, the relative offsets being different from each other, each of the restraining portions being capable of passing through the recess of the protruding portion correspondingly; and
   a retaining member disposed on one of the protruding portions and covering the recess correspondingly;
   wherein when the second assembly member is assembled to the first assembly member, one of the restraining portions abuts against the retaining member.

2. The assembly structure of claim 1, wherein the restraining portions are formed by bending a periphery of the second assembly member.

3. The assembly structure of claim 1, further comprising a plurality of fixing members, the first assembly member further comprising a plurality of fixing holes, the second assembly member further comprising a plurality of through holes, the through holes being disposed with respect to the fixing holes, the fixing members passing through the through holes and being fixed in the fixing holes.

4. The assembly structure of claim 1, wherein the retaining member has a clamping portion and the retaining member clamps one of the protruding portions by the clamping portion.

5. The assembly structure of claim 1, wherein the second assembly member further comprises a plurality of marks and the marks are disposed with respect to the restraining portions and configured to indicate the relative offsets.

6. The assembly structure of claim 1, further comprising an elastic member, the first assembly member further comprising a first positioning portion, the second assembly member further comprising a second positioning portion, the second positioning portion being disposed with respect to the first positioning portion, opposite ends of the elastic member abutting against the first positioning portion and the second positioning portion to position the first assembly member and the second assembly member.

7. The assembly structure of claim 6, wherein the elastic member is a V-shaped elastic plate or a spring.

8. The assembly structure of claim 1, wherein the first assembly member is a front bezel of a display device and the second assembly member is a back plate of a display module of the display device.

9. The assembly structure of claim 1, wherein the protruding portions comprises a first set of protruding portions and a second set of protruding portions, the restraining portions comprises a first set of restraining portions and a second set of restraining portions, and an arrangement direction of the first set of protruding portions is different from an arrangement direction of the second set of protruding portions.

10. A display device comprising:
a display unit; and
an assembly structure, the display unit being disposed in the assembly structure, the assembly structure comprising:
- a first assembly member comprising a plurality of protruding portions, each of the protruding portions having a recess;
- a second assembly member comprising a plurality of restraining portions, the restraining portions being disposed with respect to the protruding portions by a plurality of relative offsets, the relative offsets being different from each other, each of the restraining portions being capable of passing through the recess of the protruding portion correspondingly; and
- a retaining member disposed on one of the protruding portions and covering the recess correspondingly;
- wherein when the second assembly member is assembled to the first assembly member, one of the restraining portions abuts against the retaining member.

11. The display device of claim 10, wherein the restraining portions are formed by bending a periphery of the second assembly member.

12. The display device of claim 10, wherein the assembly structure further comprises a plurality of fixing members, the first assembly member further comprises a plurality of fixing holes, the second assembly member further comprises a plurality of through holes, the through holes are disposed with respect to the fixing holes, and the fixing members pass through the through holes and are fixed in the fixing holes.

13. The display device of claim 10, wherein the retaining member has a clamping portion and the retaining member clamps one of the protruding portions by the clamping portion.

14. The display device of claim 10, wherein the second assembly member further comprises a plurality of marks and the marks are disposed with respect to the restraining portions and configured to indicate the relative offsets.

15. The display device of claim 10, wherein the assembly structure further comprises an elastic member, the first assembly member further comprises a first positioning portion, the second assembly member further comprises a second positioning portion, the second positioning portion are disposed with respect to the first positioning portion, and opposite ends of the elastic member abut against the first positioning portion and the second positioning portion to position the first assembly member and the second assembly member.

16. The display device of claim 15, wherein the elastic member is a V-shaped elastic plate or a spring.

17. The display device of claim 10, wherein the first assembly member is a front bezel of a display device and the second assembly member is a back plate of a display module of the display device.

18. The display device of claim 10, wherein the protruding portions comprises a first set of protruding portions and a second set of protruding portions, the restraining portions comprises a first set of restraining portions and a second set of restraining portions, and an arrangement direction of the first set of protruding portions is different from an arrangement direction of the second set of protruding portions.

* * * * *